(12) United States Patent
Chauhan et al.

(10) Patent No.: US 10,667,429 B2
(45) Date of Patent: May 26, 2020

(54) INTEGRATED HEAT EXCHANGE ASSEMBLY AND AN ASSOCIATED METHOD THEREOF

(71) Applicant: GENERAL ELECTRIC COMPANY, Schenectady, NY (US)

(72) Inventors: Shakti Singh Chauhan, Guilderland, NY (US); Hendrik Pieter Jacobus De Bock, Clifton Park, NY (US); Graham Charles Kirk, Milton Keynes (GB); Stanton Earl Weaver, Jr., Broadalbin, NY (US); David Shannon Slaton, Huntsville, AL (US); Tao Deng, Shanghai (CN); Pramod Chamarthy, Revere, MA (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 183 days.

(21) Appl. No.: 15/699,713

(22) Filed: Sep. 8, 2017

(65) Prior Publication Data

US 2017/0374764 A1    Dec. 28, 2017

Related U.S. Application Data

(62) Division of application No. 14/106,207, filed on Dec. 13, 2013, now abandoned.

(51) Int. Cl.
*H05K 7/20* (2006.01)
*F28D 15/02* (2006.01)
(Continued)

(52) U.S. Cl.
CPC ..... *H05K 7/20336* (2013.01); *F28D 15/0275* (2013.01); *F28D 15/04* (2013.01);
(Continued)

(58) Field of Classification Search
CPC ..... H05K 7/20336; H01L 23/36; H01L 23/40; H01L 21/4882; H01L 23/427; F28D 15/0275; F28D 15/04
See application file for complete search history.

(56) References Cited

U.S. PATENT DOCUMENTS 5,296,739 A * 3/1994 Heilbronner ........ H01L 23/4006
165/80.2
5,650,662 A    7/1997 Edwards et al.
(Continued)

OTHER PUBLICATIONS

Christopher Chapman; "Larger Packages Fuel Thermal Strategies", Electronics Manufacturing Technical Articles; posted by Aavid Thermalloy, LLC; May 6, 1999; Downloaded from internet<:http://www.digikey.com/Web%20Export/Supplier%20Content/Aavid_59/PDF/Aavid_FuelingThermalStrategies.pdf?redirected=1on Jul. 22, 2013>; 3 Pages.

(Continued)

*Primary Examiner* — Jon T. Schermerhorn, Jr.
(74) *Attorney, Agent, or Firm* — Fletcher Yoder, P.C.

(57) ABSTRACT

A system, such as a heat exchange assembly includes a support structure having a recess, a first support end, a second support end, and a support portion extending between the first and second support ends. The support structure further includes a plurality of projections protruding from a portion of a surface of the support structure, corresponding to the support portion. The support structure is a primary heat sink. The heat exchange assembly includes a vapor chamber having a casing and a wick disposed within the casing. The vapor chamber is disposed within the recess and coupled to a surface of the support structure such that the plurality of projections surrounds the vapor chamber. The casing includes a mid projected portion disposed at an evaporator portion of the vapor chamber. The first and
(Continued)

second support ends, and the mid projected portion include a non-uniform surface configured to contact the circuit card.

20 Claims, 14 Drawing Sheets

(51) Int. Cl.
    *F28D 15/04* (2006.01)
    *H01L 23/40* (2006.01)
    *H01L 23/427* (2006.01)
    *H01L 21/48* (2006.01)
    *H01L 23/36* (2006.01)

(52) U.S. Cl.
    CPC .......... *H01L 21/4882* (2013.01); *H01L 23/36* (2013.01); *H01L 23/40* (2013.01); *H01L 23/427* (2013.01); *H01L 2924/0002* (2013.01)

(56) References Cited

U.S. PATENT DOCUMENTS

| | | | | |
|---|---|---|---|---|
| 6,212,074 | B1 * | 4/2001 | Gonsalves | H01L 23/4006 165/185 |
| 6,219,239 | B1 * | 4/2001 | Mellberg | H05K 7/1431 165/80.3 |
| 6,229,702 | B1 * | 5/2001 | Tao | H01L 23/3675 165/80.2 |
| 6,328,097 | B1 | 12/2001 | Bookhardt et al. | |
| 6,650,544 | B1 * | 11/2003 | Lai | F28D 15/046 165/104.21 |
| 6,661,660 | B2 | 12/2003 | Prasher et al. | |
| 6,724,626 | B1 | 4/2004 | Hodes et al. | |
| 7,186,590 | B2 * | 3/2007 | Alcoe | H01L 23/10 257/704 |
| RE39,957 | E | 12/2007 | Huang et al. | |
| 7,745,262 | B2 | 6/2010 | Huang et al. | |
| 8,018,719 | B2 * | 9/2011 | Busch | F28D 15/0233 165/104.33 |
| 8,062,933 | B2 | 11/2011 | Huang et al. | |
| 8,174,828 | B2 * | 5/2012 | Tilton | H01L 23/427 165/104.33 |
| 8,376,032 | B2 | 2/2013 | Song et al. | |
| 8,437,137 | B2 * | 5/2013 | Lee | H01L 23/4006 165/185 |
| 2004/0244951 | A1 | 12/2004 | Dussinger et al. | |
| 2009/0223647 | A1 | 9/2009 | Alousi et al. | |
| 2015/0084182 | A1 | 3/2015 | De Cecco et al. | |
| 2017/0251572 | A1 * | 8/2017 | Kirk | H05K 7/1404 |

OTHER PUBLICATIONS

Veitl, "Ceramic Simplifies Heat Dissipation", Luger Research and LED-Professional, Review, 2009, Issue 12, pp. 1-6.
EP Search Report dated Apr. 28, 2015 in relation to corresponding EP application 14197122.6, 6 Pages.

* cited by examiner

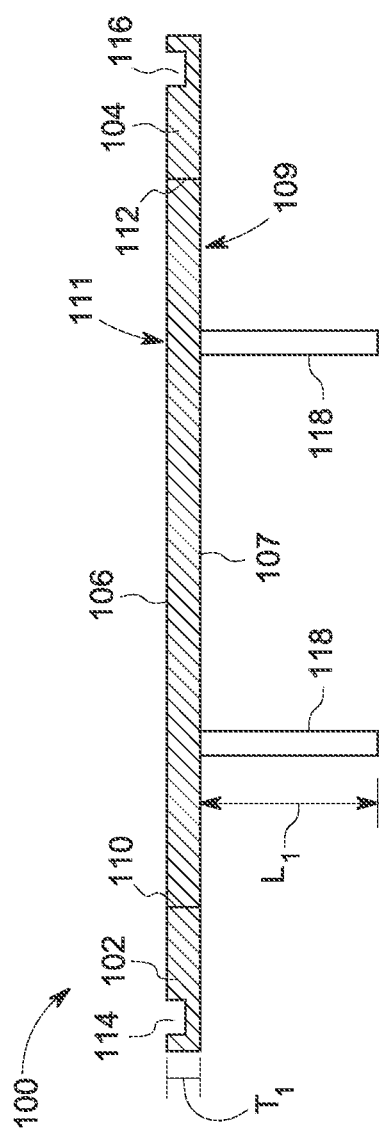
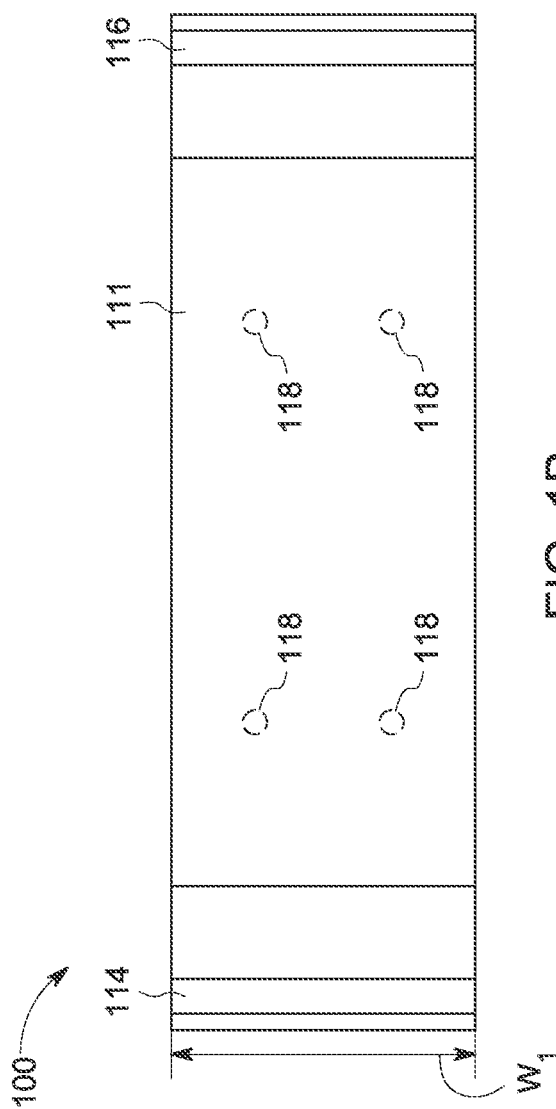
FIG. 1A
FIG. 1B

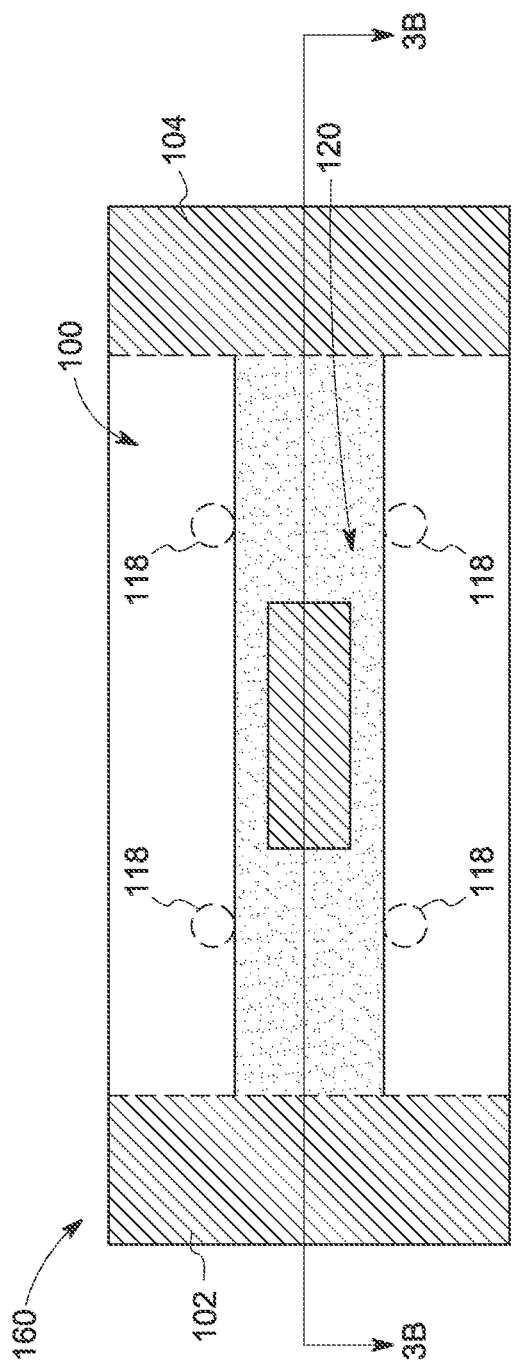
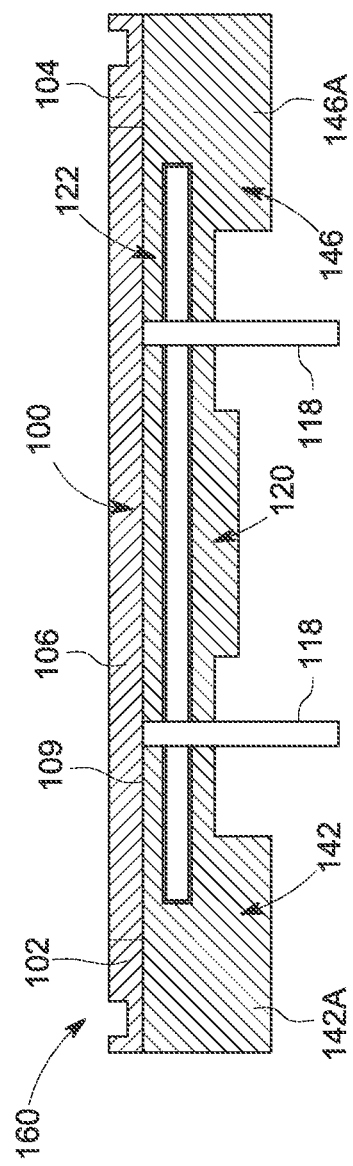
FIG. 3A
FIG. 3B

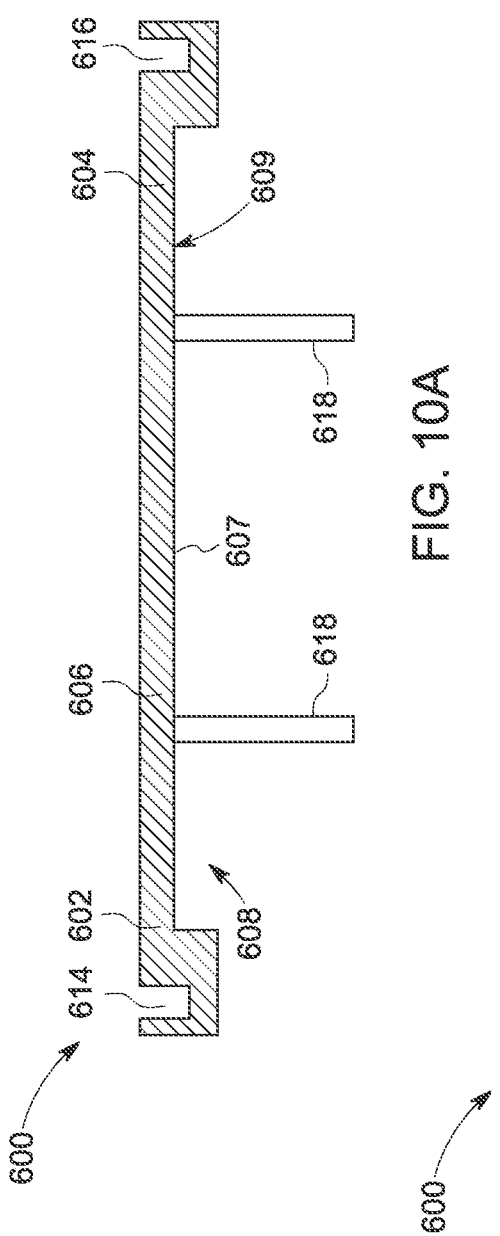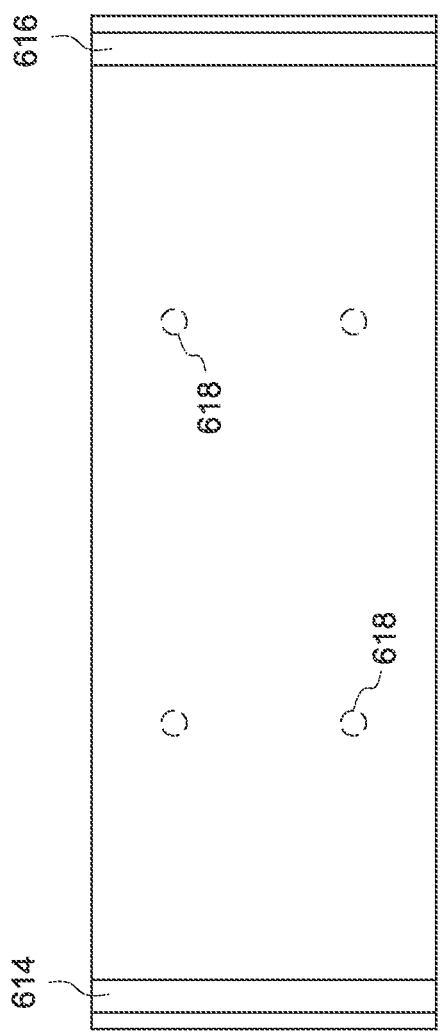

INTEGRATED HEAT EXCHANGE ASSEMBLY AND AN ASSOCIATED METHOD THEREOF

CROSS REFERENCE TO RELATED APPLICATIONS

This patent application is a divisional of U.S. Non-Provisional patent application Ser. No. 14/106,207 filed on Dec. 13, 2013, which is incorporated by reference herein in its entirety.

BACKGROUND

The present patent application relates generally to a heat exchange assembly, and more particularly, to an integrated heat exchange assembly having a support structure and a vapor chamber disposed over a hot component of a circuit card, for dissipation of generated heat.

Electrical devices often produce heat during operation that needs to be dissipated. A heat dissipation device includes a heat exchange assembly having a heat spreader coupled to a hot component of an electrical device, so as to dissipate the heat generated from the hot component to a heat sink via the heat spreader. The heat spreader typically includes a solid plate made of copper or aluminum material. The heat spreader generally dissipates heat by transferring heat along a tortuous heat path from the hot component to the heat sink via the heat spreader. Such devices have a limited heat transfer capacity because of a longer heat travel path from the hot component to the heat sink and limitations on the maximum temperature logic devices can experience without sacrificing reliability.

During assembling of such a heat exchange assembly within a housing of an electrical device, non-planarity and height mismatches between the housing and the components may also occur. Due to the limited flexibility of the heat spreader, the heat sink, and the planar architecture of the housing, a thermal interface material may be disposed between the hot component and the heat spreader. Such a thermal interface material has to be thick and compliant, resulting in substantial thermal resistance, which reduces the efficiency of heat transfer from the hot component to the heat sink.

Accordingly, there is a need for an improved heat exchange assembly.

BRIEF DESCRIPTION

In accordance with one exemplary embodiment, a system such as a heat exchange assembly is disclosed. The heat exchange assembly includes a support structure and a vapor chamber. The support structure includes a recess, a first support end, a second support end, a support portion extending between the first support end and the second support end, and a plurality of projections protruding from a portion of a surface of the support structure, corresponding to the support portion. The support structure is a primary heat sink. The vapor chamber includes a casing and a wick disposed within the casing. The vapor chamber is disposed within the recess and coupled to the surface of the support structure such that the plurality of projections surrounds the vapor chamber. The casing includes a mid projected portion disposed at an evaporator portion of the vapor chamber. The first and second support ends, and the mid projected portion include a non-uniform surface configured to contact a circuit card.

In accordance with another exemplary embodiment, a method of dissipating heat from a hot component of a circuit card is disclosed. The method includes absorbing heat from a hot component by conduction through an evaporator portion of a vapor chamber. Further, the method includes evaporating a working fluid disposed within the casing, using the absorbed heat, so as to generate a vaporized working fluid. The method further includes transporting the vaporized working fluid from the evaporator portion to a condenser portion of the vapor chamber. Further, the method includes condensing the vaporized working fluid via the condenser portion by dissipating the absorbed heat along a plurality of directions in the casing, to a support structure. The support structure is a primary heat sink and includes a recess, a first support end, a second support end, a support portion extending between the first support end and the second support end, and a plurality of projections protruding from a portion of a surface of the support structure, corresponding to the support portion. The vapor chamber is disposed within the recess and coupled to the surface of the support structure such that the plurality of projections surrounds the vapor chamber. The casing includes a mid projected portion disposed at an evaporator portion of the vapor chamber. The first and second support ends, and the mid projected portion include a non-uniform surface configured to contact a circuit card.

In accordance with yet another exemplary embodiment, an electrical device having a heat exchange assembly is disclosed. The electrical device includes a hot component, a support structure, a vapor chamber, and a plurality of spring loaded clamping devices. The hot component is coupled to a circuit card having a plurality of holes. The hot component and the circuit card are disposed within a housing. The support structure includes a recess, a first support end, a second support end, a support portion extending between the first support end and the second support end, and a plurality of projections protruding from a portion of a surface of the support structure, corresponding to the support portion. The support structure is a primary heat sink. The vapor chamber includes a casing and a wick disposed within the casing. The vapor chamber is disposed within the recess and coupled to the surface of the support structure such that the plurality of projections surrounds the vapor chamber. The casing includes a mid projected portion disposed at an evaporator portion of the vapor chamber. The first and second support ends, and the mid projected portion include a non-uniform surface configured to contact a circuit card. Further, the vapor chamber is coupled to the hot component via a thermal interface material. Each spring loaded clamping device is coupled to a corresponding hole in the corresponding first projection so as to clamp the circuit card to the support structure.

DRAWINGS

These and other features and aspects of embodiments of the present disclosure will become better understood when the following detailed description is read with reference to the accompanying drawings in which like characters represent like parts throughout the drawings, wherein:

FIG. 1a illustrates a schematic front sectional view of a support structure in accordance with an exemplary embodiment;

FIG. 1b illustrates a top view of the support structure in accordance with the exemplary embodiment of FIG. 1a;

FIG. 2b illustrates a top view of the vapor chamber in accordance with the exemplary embodiment of FIG. 2a;

FIG. 3a illustrates a top view of the heat exchange assembly having the support structure and the vapor chamber in accordance with the exemplary embodiments of FIGS. 1a, 1b, 2a, and 2b;

FIG. 3b illustrates a schematic front sectional view of a heat exchange assembly having the support structure and the vapor chamber in accordance with the exemplary embodiment of FIG. 3a;

FIG. 10a illustrates a schematic front sectional view of a support structure in accordance with yet another exemplary embodiment;

FIG. 10b illustrates a top view of the support structure in accordance with the exemplary embodiment of FIG. 10a;

FIG. 11b illustrates a top view of the vapor chamber in accordance with the exemplary embodiment of FIG. 11a;

FIG. 12b illustrates a schematic front sectional view of a heat exchange assembly in accordance with the exemplary embodiment of FIG. 12a;

FIG. 17b illustrates a schematic front sectional view of a heat exchange assembly having the support structure and the vapor chamber in accordance with the exemplary embodiment of FIG. 17a.

DETAILED DESCRIPTION

Figure 2A:
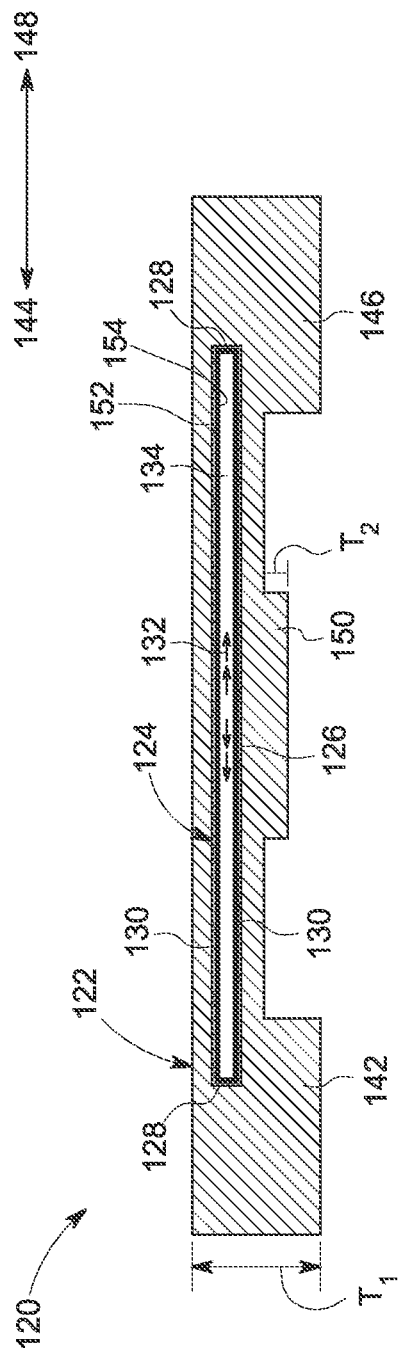
FIG. 2a illustrates a schematic front sectional view of a vapor chamber in accordance with an exemplary embodiment.

While only certain features of embodiments have been illustrated and described herein, many modifications and changes will occur to those skilled in the art. It is, therefore, to be understood that the appended claims are intended to cover all such modifications and changes as falling within the spirit of the invention.

Embodiments discussed herein disclose a heat exchange assembly. More particularly, certain embodiments disclose a heat exchange assembly having a support structure and a vapor chamber. The support structure, for example, is a primary heat sink having a first support end, a second support end, a support portion extending between the first support end and the second support end, and a plurality of first projections protruding from a portion of a surface of the support structure, corresponding to the support portion. The vapor chamber includes a casing and a wick disposed within the casing. The vapor chamber is coupled to the surface of the support structure. The heat exchange assembly is coupled to a hot component of a circuit card, for dissipating heat from the hot component.

More particularly, certain embodiments disclose a method for dissipating heat from a hot component of a circuit card. Specifically, the method involves absorbing heat from the hot component by conducting the heat through an evaporator portion of a vapor chamber. The method further involves vaporizing a working fluid disposed within a casing of the vapor chamber so as to generate a vaporized working fluid. Further, the vaporized working fluid is transported from the evaporator portion to a condenser portion of the vapor chamber via a transport portion. In some embodiments, the vaporized working fluid may be transported from the evaporator portion to one or more condenser portions of the vapor chamber. The method further involves condensing the vaporized working fluid via the condenser portion by dissipating the absorbed heat along a plurality of directions in the casing to a support structure.

FIG. 1a represents a schematic front sectional view of a support structure 100, for example, a primary heat sink, in accordance with an exemplary embodiment. The support structure 100 includes a first support end 102, a second support end 104, a support portion 106, and a plurality of first projections 118.

In the illustrated embodiment, the support portion 106 extends between the first and second support ends 102, 104. The plurality of first projections 118 protrude outwards from the support portion 106. More specifically, the plurality of first projections 118 protrude from a portion 107 of a surface 109 of the support structure 100. The first support end 102 has a first wedge lock recess 114 and the second support end 104 has a second wedge lock recess 116. More specifically, the first and second wedge lock recesses 114, 116 are disposed on a surface 111 of the support structure 100. Each first projection 118 has a length "$L_1$", and the support portion 106, the first and second support ends 102, 104 have a thickness "$T_1$". In the illustrated embodiment, specifically, the plurality of first projections 118 protrude orthogonally from the support portion 106. The number of first projections 118 may vary depending upon the application and design criteria.

The first and second wedge lock recesses 114, 116 are used for locking the support structure 100 to a housing of an electrical device (not shown in FIG. 1a). The plurality of first projections 118 enables holding a circuit card (not shown in FIG. 1a) of the electrical device.

In one embodiment, the first and second support ends 102, 104 are formed separately from the support portion 106. In such embodiments, a first peripheral end 110 of the support portion 106 is coupled to the first support end 102 and a second peripheral end 112 of the support portion 106 is coupled to the second support end 104 by welding, brazing, bolting, or the like. In one embodiment, the first and second support ends 102, 104 are made of a first material and the support portion 106 is made of a second material different from the first material. The first material and the second material may include aluminum nitride, copper, and the like. In another embodiment, the first and second support ends 102, 104 and the support portion 106 are formed together as an integral component. In such embodiments, the first and second support ends 102, 104 and the support portion 106 are formed of the same material. In some other embodiment, the support structure 100 may include a third support end and a fourth support end extending from remaining peripheral ends of the support portion 106 and projecting perpendicular to the first and second support ends 102, 104. The number of such support ends of the support structure 100 may vary depending on the application and design criteria.

FIG. 1b illustrates a top view of the support structure 100 in accordance with an exemplary embodiment. The support structure 100 has a width "$W_1$". In the illustrated embodiment, as discussed herein, the surface 111 of the support structure 100 has the first wedge lock recess 114 and the second wedge lock recess 116.

FIG. 2a illustrates a schematic front sectional view of a vapor chamber 120 in accordance with an exemplary embodiment. The vapor chamber 120 includes a casing 122 and a wick 124 disposed within the casing 122.

The vapor chamber 120 includes an evaporator portion 126, a condenser portion 128, and a transport portion 130 extending between the evaporator portion 126 and the condenser portion 128. Further, the vapor chamber 120 includes a working fluid 132 filled within a cavity 134 of the vapor chamber 120. The working fluid 132 may include water or alcohol depending on the application and design criteria.

The casing 122 includes a first projected end portion 142 extending along a first direction 144 and a second projected end portion 146 extending along a second direction 148 opposite to the first direction 144. Further, the casing 122 includes a mid projected portion 150 disposed between the first projected end portion 142 and the second projected end portion 146. The mid projected portion 150 substantially spans the evaporator portion 126 of the vapor chamber 120.

The first projected end portion 142 and the second projected end portion 146 have a first thickness "$T_1$" and the mid projected portion 150 has a second thickness "$T_2$" different from the first thickness "$T_1$". The different thicknesses "$T_1$" and "$T_2$" facilitate the vapor chamber 120 to accommodate a hot component (not shown in FIG. 1b) of varying height.

The wick 124 includes a plurality of sintered layers 152, 154 disposed one above the other for vaporizing the working fluid 132 in the evaporator portion 126 and condensing the vaporized working fluid 132 in the condenser portion 128. Each sintered layer 152, 154 may have a varying pore size and porosity (not shown in FIG. 1b) depending on the application and design criteria.

In some other embodiments, the vapor chamber 120 may include a third projected end portion and a fourth projected end portion extending from remaining peripheral ends of the casing 122 and projecting perpendicular to the first and second projected end portions 142, 146. The number of such projected end portions of the vapor chamber 120 may vary depending on the application and design criteria.

Figure 2B:
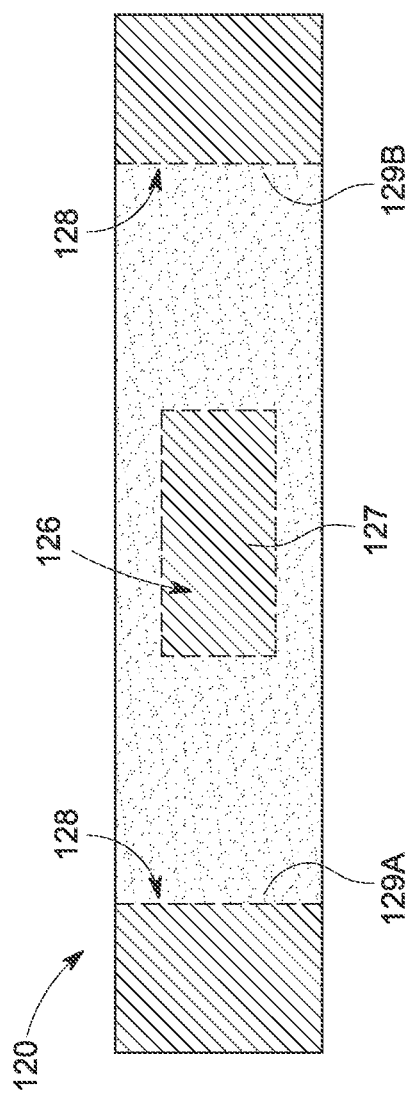

FIG. 2b illustrates a top view of the vapor chamber 120 in accordance with the exemplary embodiment of FIG. 2a. In the illustrated embodiment, the vapor chamber 120 has an evaporator portion 126 at a middle portion 127 and the condenser portions 128 at peripheral ends 129a, 129b of the casing 122.

FIG. 3a illustrates a schematic top view of the heat exchange assembly 160 having the support structure 100 and the vapor chamber 120 in accordance with the exemplary embodiments of FIGS. 1a, 1b, 2a, and 2b. In the illustrated embodiment, the vapor chamber 120 extends between the first support end 102 and the second support end 104 of the support structure 100 and are surrounded by the plurality of first projections 118.

FIG. 3b illustrates a sectional front view along an axis 3b-3b of the heat exchange assembly 160 having the support structure 100 and the vapor chamber 120 in accordance with the exemplary embodiment of FIG. 3a.

In the illustrated embodiment, the vapor chamber 120 is coupled to the surface 109 of the support structure 100 such that a first end projection 142a of the first projected end portion 142 of the casing 122 overlaps the first support end 102 of the support structure 100 and a second projection 146a of the second projected end portion 146 of the casing 122 overlaps the second support end 104 of the support structure 100. In the illustrated embodiment, the thickness "$T_1$" of the casing is different than the length "$L_1$" of the plurality of first projections 118 of the support structure 100. The length "$L_1$" of the support structure 100 is greater than the thickness "$T_1$" of the casing 122.

Figure 4:
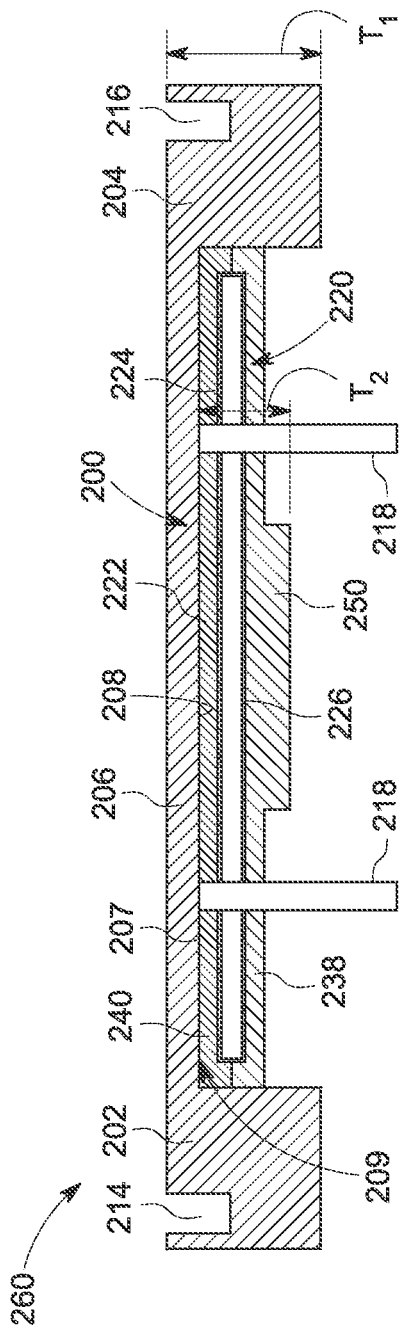
FIG. 4 illustrates a schematic front sectional view of a heat exchange assembly in accordance with another exemplary embodiment.

FIG. 4 illustrates a schematic front sectional view of a heat exchange assembly 260 in accordance with another exemplary embodiment. In the illustrated embodiment, the heat exchange assembly 260 includes a support structure 200 and a vapor chamber 220. The support structure 200 includes a first support end 202, a second support end 204, and a support portion 206 having a recess 208 formed between the first support end 202 and the second support end 204. The support structure 200 further includes a plurality of first projections 218 protruding from a portion 207 of a surface 209 of the support structure 200, corresponding to the support portion 206.

In the illustrated embodiment, the vapor chamber 220 includes a casing 222 and a wick 224 disposed within the casing 222. The casing 222 has a rectangular shape. The casing 222 includes a first half casing portion 238 and a second half casing portion 240 coupled to each other by welding, brazing, bolting, or the like. Each half casing portion 238, 240 has a U-shape. The vapor chamber 220 is disposed within the recess 208 such that the plurality of first projections 218 are disposed surrounding the vapor chamber 220. The first support end 202 has a first wedge lock recess 214 and the second support end 204 has a second wedge lock recess 216. The casing 222 of the vapor chamber 220 further includes a mid projected portion 250 disposed at an evaporator portion 226 of the vapor chamber 220. The first and second support ends 202, 204 of the support structure 200 have a thickness "$T_1$" and the vapor chamber 220 has a thickness "$T_2$" different from the thickness "$T_1$". The different thicknesses "$T_1$" and "$T_2$" facilitate coupling of the vapor chamber 220 to the support structure 200.

Figure 5:
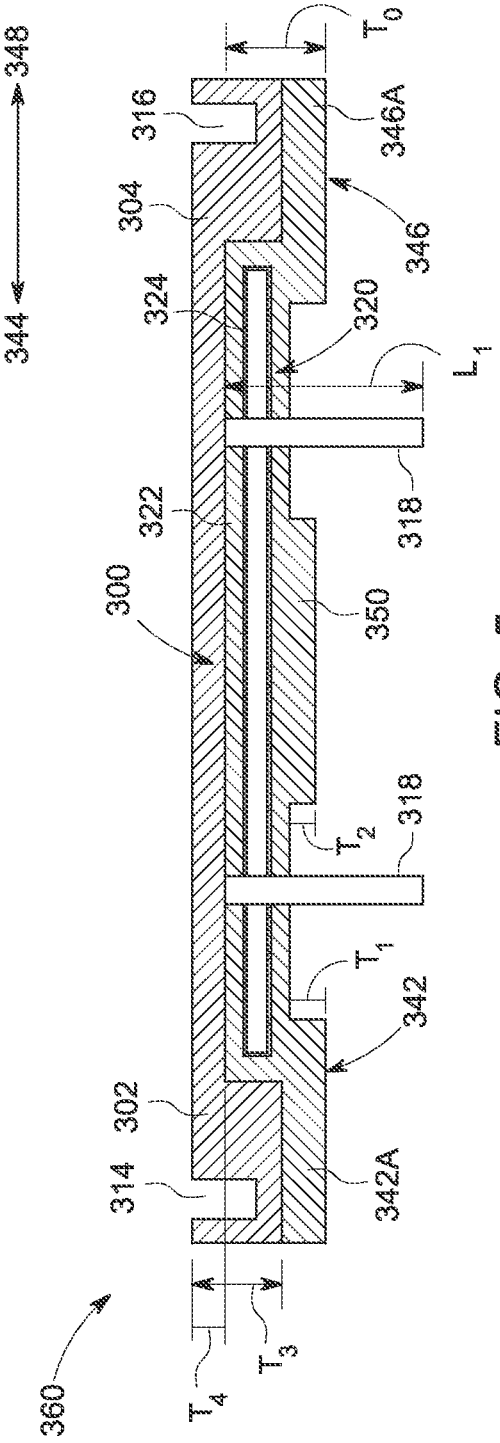
FIG. 5 illustrates a schematic front sectional view of a heat exchange assembly in accordance with yet another exemplary embodiment.

FIG. 5 illustrates a schematic front sectional view of a heat exchange assembly 360 in accordance with another exemplary embodiment. In the illustrated embodiment, the heat exchange assembly 360 includes a support structure 300 and a vapor chamber 320. The vapor chamber 320 includes a casing 322 and a wick 324 disposed within the casing 322. The casing 322 includes a first projected end portion 342 extending along a first direction 344 and a second projected end portion 346 extending along a second direction 348 opposite to the first direction 344. A first end projection 342a of the first projected end portion 342 of the casing 322 overlaps a first support end 302 of the support structure 300 and a second end projection 342b of the second projected end portion 346 of the casing 322 overlaps a second support end 304 of the support structure 300. The support structure 300 includes a plurality of first projection 318 having a length "$L_1$" and the casing 322 having a thickness "$T_0$". The length "$L_1$" is different from the thickness "$T_0$" so as to facilitate mounting of a hot component of a circuit card (not shown in FIG. 5) to the heat exchange assembly 360. The first support end 302 has a first wedge lock recess 314 and the second support end 304 has a second wedge lock recess 316.

The first and second projected end portions 342, 346 have a first thickness "$T_1$" and a mid projected portion 350 has a second thickness "$T_2$" different from the first thickness "$T_1$". The different thicknesses "$T_1$" and "$T_2$" facilitate the vapor chamber 320 to accommodate the hot component (not shown in FIG. 5) of varying height. The first and second support ends 302, 304 have a first thickness "$T_3$" and the support portion 306 has a second thickness "$T_4$" different from the first thickness "$T_3$".

Figure 6:
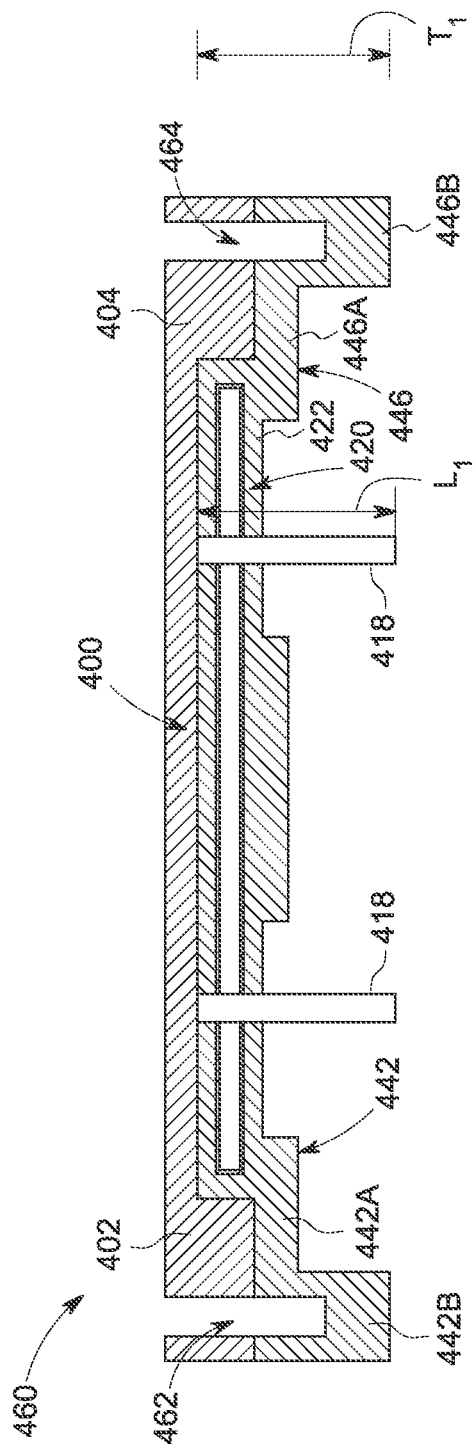
FIG. 6 illustrates a schematic front sectional view of a heat exchange assembly in accordance with yet another exemplary embodiment.

FIG. 6 illustrates a schematic front sectional view of a heat exchange assembly 460 in accordance with another exemplary embodiment. In the illustrated embodiment, the heat exchange assembly 460 includes a support structure 400 and a vapor chamber 420. The support structure 400 includes a first support end 402 and a second support end 404. The vapor chamber 420 includes a casing 422 having a first projected end portion 442 and a second projected end portion 446. The first projected end portion 442 includes a first end projection 442a and the second projected end portion 446 includes a second end projection 446a.

The first projected end portion 442 further includes a third end projection 442b extending perpendicular from the first end projection 442a. The second projected end portion 446 further includes a fourth projected end portion 446b extending perpendicular from the second end projection 446a and parallel to the third end projection 442b. The third end projection 442b and the fourth end projection 446b are configured to support a hot component of a circuit card (not shown in FIG. 6). A first through-hole 462 is formed extending through the first support end 402 of the support structure 400, the first end projection 442a, and the third end projection 442b of the vapor chamber 420. A second through-hole 464 is formed extending through the second support end 404 of the support structure 400, the second end projection 446a, and the fourth end projection 446b of the vapor chamber 420. The plurality of first projections 418 have a length "$L_1$" and the casing 422 has a thickness "$T_1$". The length "$L_1$" is equal to the thickness "$T_1$" so as to facilitate mounting of the hot component of the circuit card to the heat exchange assembly 460.

Figure 7:
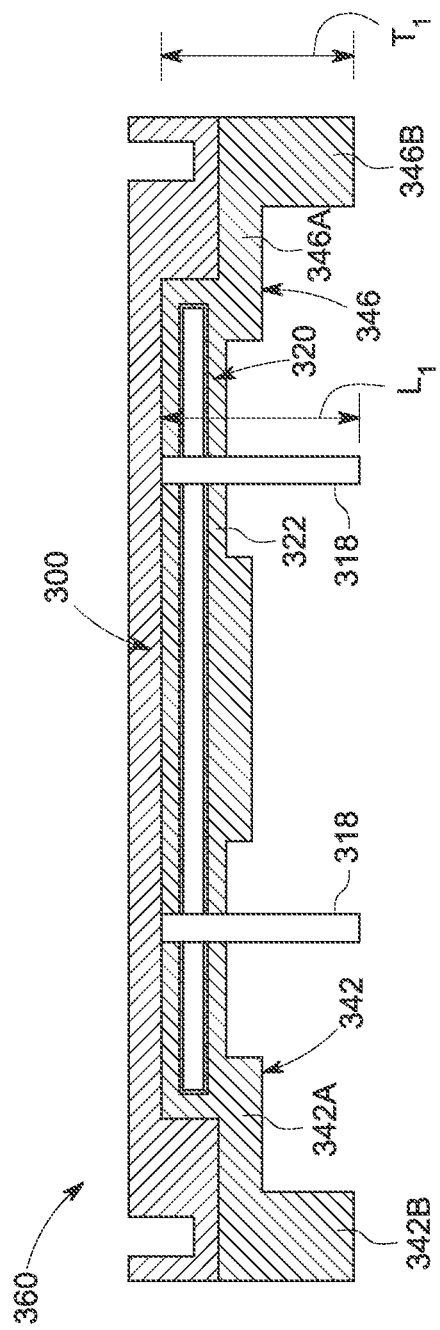
FIG. 7 illustrates a schematic front sectional view of the heat exchange assembly in accordance with the exemplary embodiment of FIG. 5.

FIG. 7 illustrates a schematic front sectional view of the heat exchange assembly 360 in accordance with the exemplary embodiment of FIG. 5. In the illustrated embodiment, the first projected end portion 342 further includes a third end projection 342b extending perpendicular from the first end projection 342a. The second projected end portion 346 further includes a fourth projected end portion 346b extending perpendicular from the second end projection 346a and parallel to the third end projection 342b. The third end projection 342b and the fourth end projection 346b are configured to support a hot component of a circuit card (not shown in FIG. 7). The plurality of first projection 318 have a length "$L_1$" and the casing 322 has a thickness "$T_1$". The length "$L_1$" is equal to the thickness "$T_1$" so as to facilitate mounting of the hot component of the circuit card to the heat exchange assembly 360.

Figure 8:
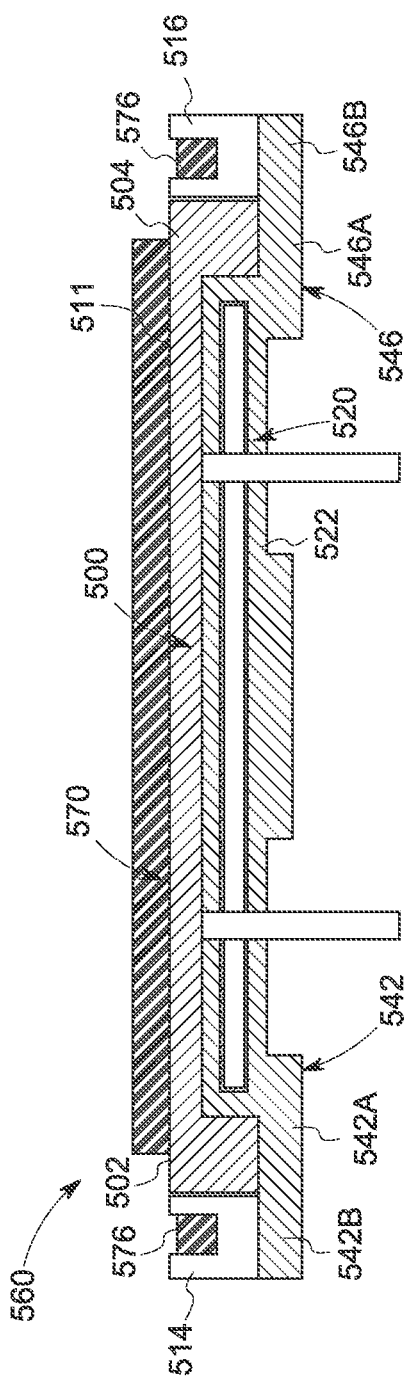
FIG. 8 illustrates a schematic front sectional view of a heat exchange assembly in accordance with yet another exemplary embodiment.

FIG. 8 illustrates a schematic front sectional view of a heat exchange assembly 560 in accordance with yet another exemplary embodiment. In the illustrated embodiment, the heat exchange assembly 560 includes a support structure 500 and a vapor chamber 520. The vapor chamber 520 includes a casing 522 having a first projected end portion 542 and a second projected end portion 546. The first projected end portion 542 includes a first end projection 542a and the first extension portion 542b extending from the first end projection 542a, beyond and perpendicular to a first support end 502 of the support structure 500. Similarly, the second projected end portion 546 includes a second end projection 546a and a second extension portion 546b extending from the second end projection 546a, beyond and perpendicular to a second support end 504 of the support structure 500. The heat exchange assembly 560 further includes a first wedge lock component 514 coupled to the first extension portion 542b and a second wedge lock component 516 coupled to the second extension portion 546b. The heat exchange assembly 560 further includes a secondary heat sink 570 coupled to a surface 511 of the support structure 500, the first wedge lock component 514, and the second wedge lock component 516, via a plurality of wedges 576 disposed in the first wedge lock component 514 and the second wedge lock component 516.

Figure 9:
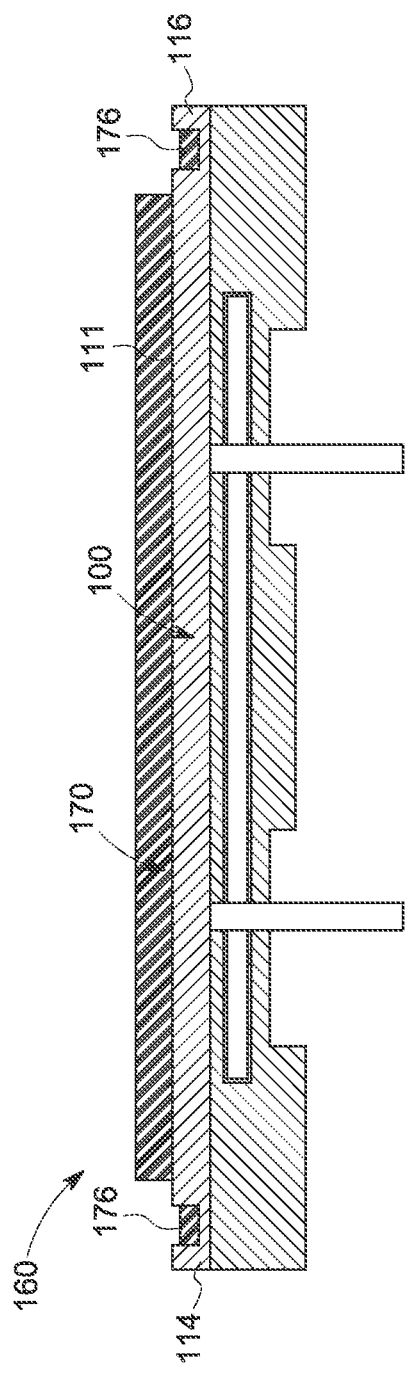
FIG. 9 illustrates a schematic front sectional view of the heat exchange assembly coupled to a heat sink in accordance with the exemplary embodiments of FIGS. 3a, and 3b.

FIG. 9 illustrates a schematic front sectional view of the heat exchange assembly 160 coupled to a secondary heat sink 170 in accordance with the exemplary embodiments of FIGS. 3a, and 3b. In the illustrated embodiment, the secondary heat sink 170 is clamped to a support surface 111 of the support structure 100, the first wedge lock recess 114, and the second wedge lock recess 116, via a plurality of wedges 176 disposed in the first wedge lock recess 114 and the second wedge lock recess 116. Similarly, with reference to FIGS. 4 and 5, the heat exchange assembly 260, 360 may include a secondary heat sink (not shown) clamped to respective support portions 206, 306 of the support structures 200, 300, the first wedge lock recesses 214, 314, and the second wedge lock recesses 216, 316, via a plurality of wedges (not shown).

FIG. 10a illustrates a schematic front sectional view of a support structure 600 in accordance with yet another exemplary embodiment. The support structure 600 includes a first support end 602, a second support end 604, and a support portion 606 having a recess 608 formed between the first support end 602 and the second support end 604. The support structure 600 further includes a plurality of first projections 618 protruding from a portion 607 of a surface 609 of the support structure 600, corresponding to the support portion 606. The first support end 602 includes a first wedge lock recess 614 and the second support end 604 includes a second wedge lock recess 616.

FIG. 10b illustrates a top view of the support structure 600 in accordance with the exemplary embodiment of FIG. 10a. The illustrated embodiment shows the first wedge lock recess 614, the second wedge lock recess 616, and the plurality of first projections 618.

Figure 11A:
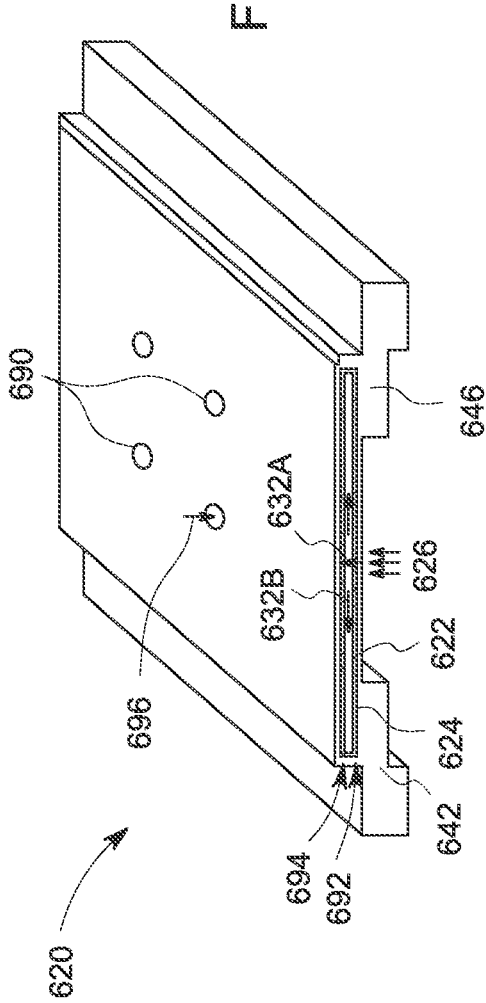
FIG. 11a illustrates a perspective side view of a vapor chamber in accordance with yet another exemplary embodiment.

FIG. 11a is a perspective side view of a vapor chamber 620 in accordance with yet another exemplary embodiment. The vapor chamber 620 includes a casing 622 and a wick 624 disposed within the casing 622. The casing 622 includes a first projected end portion 642, a second projected end portion 646, a plurality of mid projected portions (not shown in FIG. 11a), and a plurality of second projections 690. The plurality of second projections 690 extend from one side 692 to another side 694 of the casing 622. Each projection among the plurality of second projections 690 has a through-hole 696. The plurality of second projections 690 are disposed surrounding an evaporator portion 626 of the vapor chamber 620 and provide structural stability to the vapor chamber 620.

Figure 11B:
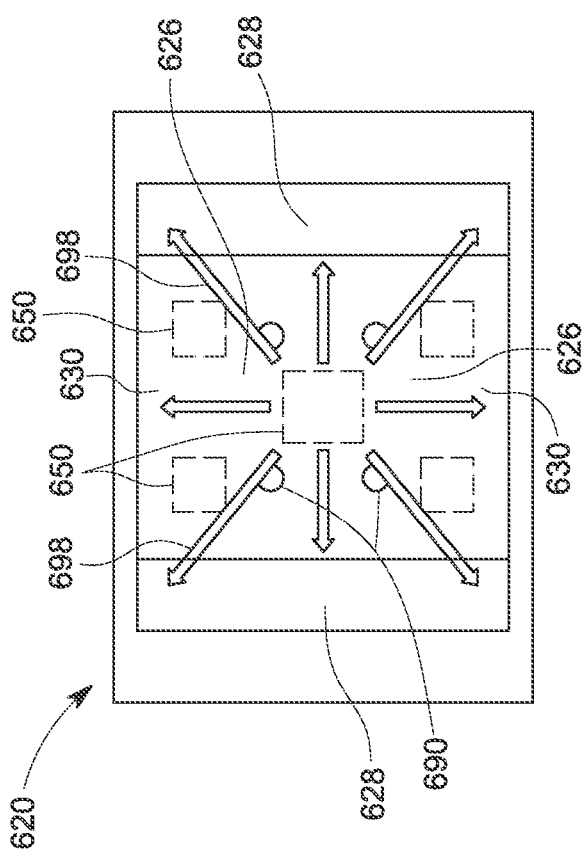

FIG. 11b illustrates a schematic top view of the vapor chamber 620 in accordance with the exemplary embodiment of FIG. 11a. The vapor chamber 620 includes the plurality of mid projected portions 650 proximate to the evaporator portion 626. The plurality of mid projected portions 650 are disposed over a hot component of a circuit card (not shown in FIGS. 11a, 11b). A working fluid 632a (shown in FIG. 11a) in the evaporator portion 626, absorbs heat from the hot component and generates a vaporized working fluid 632b (shown in FIG. 11a). The vaporized working fluid 632b is transported to a condenser portion 628 via a transport portion 630, along a plurality of directions 698. The vaporized working fluid 632b is condensed so as to regenerate the working fluid 632a in the condenser portion 628 by dissipating heat to the primary heat sink and/or secondary heat sink (not shown in FIGS. 11a, 11b). The regenerated working fluid 632a is once again re-circulated to the evaporator portion 626, for absorbing the heat further from the hot component.

Figure 12A:
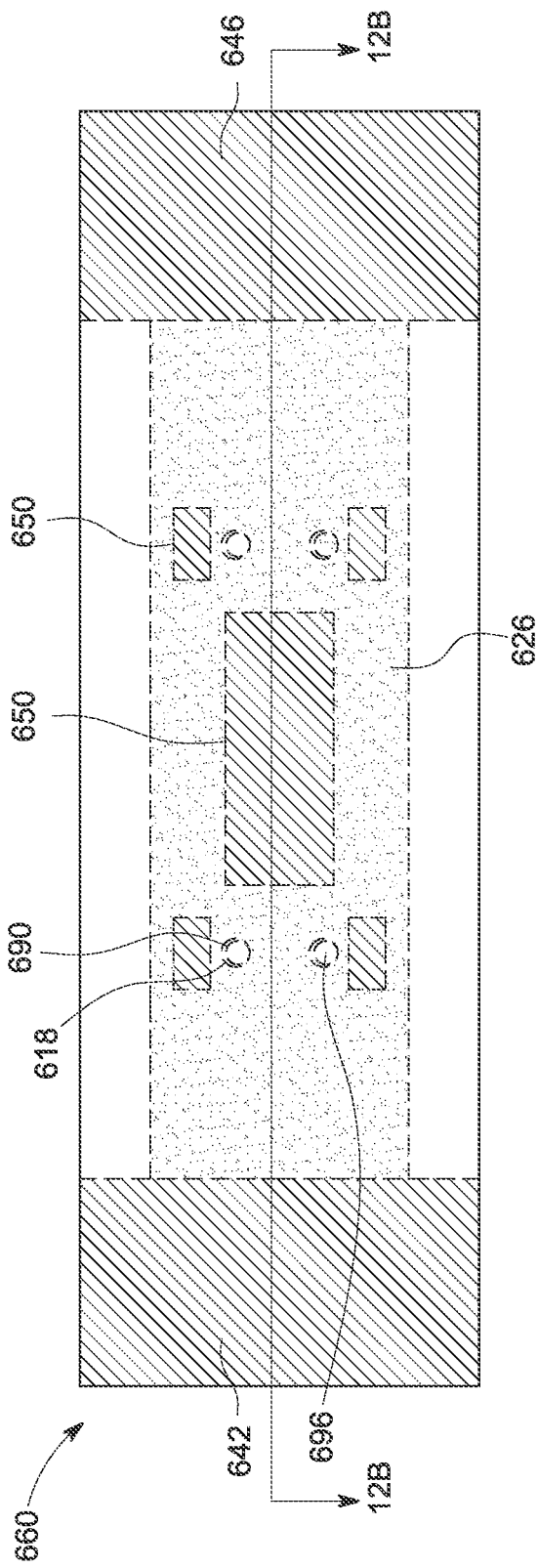
FIG. 12a illustrates a top view of a heat exchange assembly in accordance with the exemplary embodiments of FIGS. 10a, 10b, 11a, and 11b.

FIG. 12a illustrates a top view of the heat exchange assembly 660 in accordance with the exemplary embodiments of FIGS. 10a, 10b, 11a, 11b. In the illustrated embodiment, the vapor chamber 620 includes the plurality of mid projected portions 650 disposed proximate to the evaporator portion 626 of the vapor chamber 620.

Figure 12B:
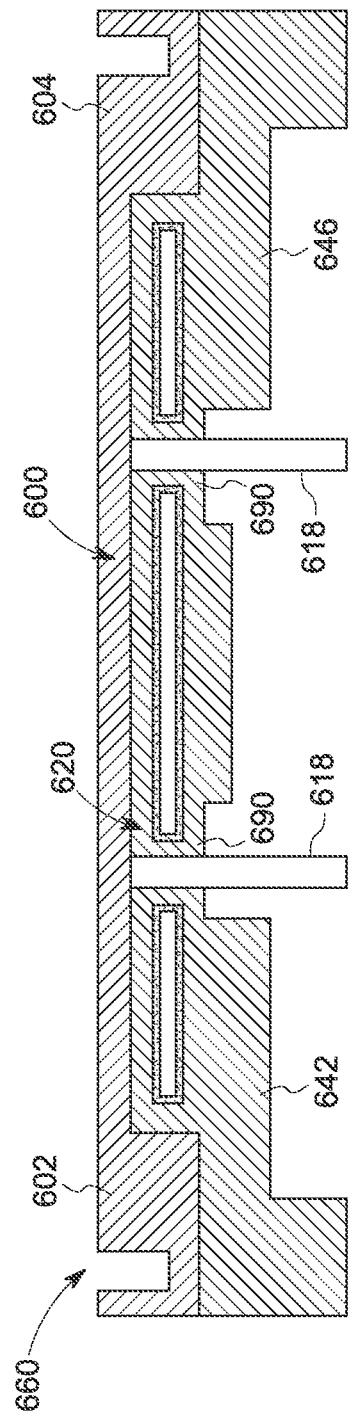

FIG. 12b illustrates a schematic front sectional view along an axis 12b-12b of the heat exchange assembly 660 in accordance with the exemplary embodiment of FIG. 12a. The support structure 600 is disposed over the vapor chamber 620 such that first support end 602 and the second support end 604 overlaps the first projected end portion 642 and the second projected end portion 646 respectively. Further, each first projection 618 is coupled to the corresponding second projection 690 via the respective through-hole 696 (as shown in FIG. 12a).

Figure 13:
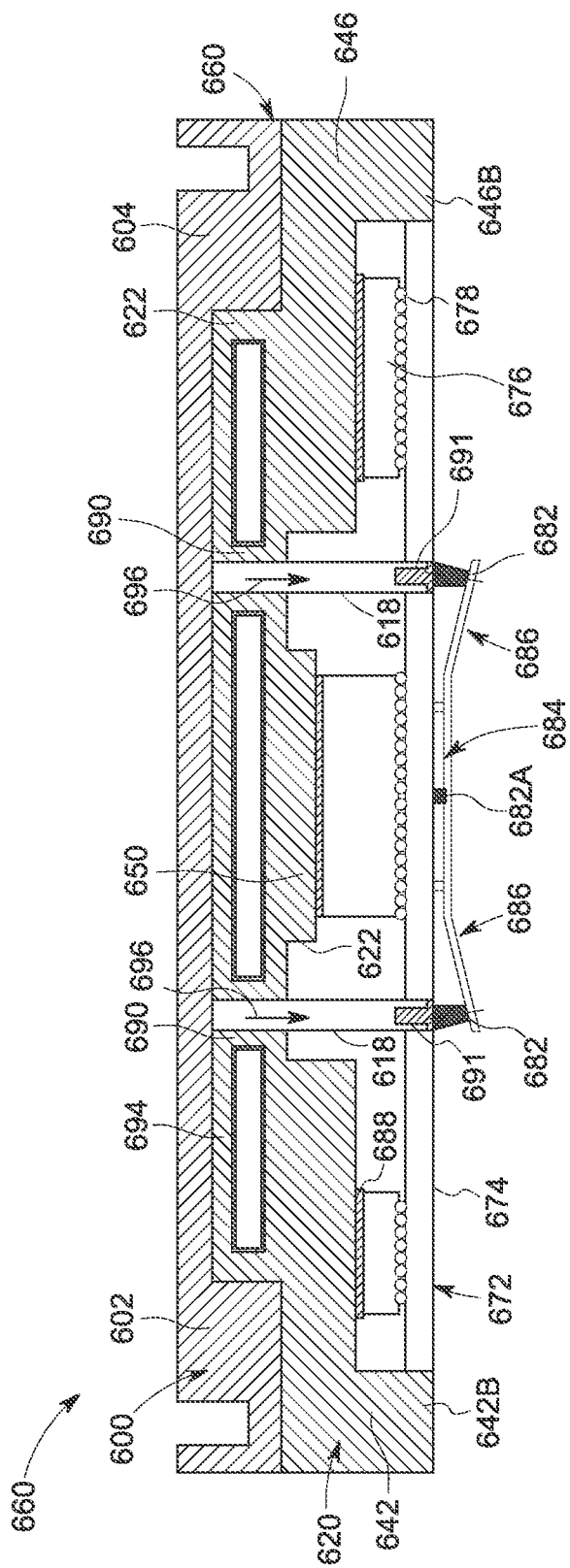
FIG. 13 illustrates a schematic front sectional view of a heat exchange assembly coupled to an electrical device in accordance with the exemplary embodiments of FIGS. 12a and 12b.

FIG. 13 illustrates a schematic front sectional view of the heat exchange assembly 660 coupled to an electrical device 672 in accordance with the exemplary embodiments of FIGS. 12a and 12b.

The heat exchange assembly 660 includes the support structure 600 and the vapor chamber 620. The support structure 600 is disposed on the vapor chamber 620 such that the first support end 602 and the second support end 604 of the support structure 600 overlaps the first projected end portion 642 and the second projected end portion 646 respectively of the vapor chamber 620. Further, each first projection 618 is coupled to the respective through-hole 696 in the corresponding second projection 690.

The electrical device 672 includes a circuit card 674 (PCB) coupled to an electrical component or a hot component 676 coupled via a ball grid array (BGA) 678. In one embodiment, the electrical device 672 is a computer or a common line replaceable unit ("LRU) and the like. The hot component 676 may be a passive device such as a memory unit, or an active unit such as a graphical processing unit (GPU) or a central processing unit (CPU).

In the illustrated embodiment, the heat exchange assembly 660 further includes a plurality of spring loaded clamping devices 682. As discussed previously, each first projection 618 is coupled to the through-hole 696 of the corresponding second projection 690 of the casing 622. Further, each spring loaded clamping device 682 is coupled to a corresponding hole 691 in a corresponding first projection 618 so as to clamp the circuit card 674 to the support structure 600. The heat exchange assembly 660 further includes an additional spring loaded clamping device 682a. Each spring loaded clamping device 682 and the additional spring loaded clamping device 682a are mounted on a beam 684 having a plurality of hinges 686 for flexibly supporting the circuit card 674. Each spring loaded clamping device 682, 682a along with the corresponding hinge 686 can move up and down so as to accommodate the height variation of the respective hot component 676 during assembling of the heat exchange device 660.

In the illustrated embodiment, the heat exchange assembly 660 also includes a thermal interface material (herein after referred as "TIM") 688 disposed on the hot component 676 to enable thermal conductivity between the hot component 676 and at least one of the first projected end portion 642, the second projected end portion 646, and the mid projected portion 650 of the vapor chamber 620. In another embodiment, at least one of the first projected end portion 642, the second projected end portion 646, and the mid projected portion 650 may be mounted directly on the hot component 676.

The third projection 642b and the fourth projection 646b are configured to hold the circuit card 674 which support the hot component 676.

Figure 14:
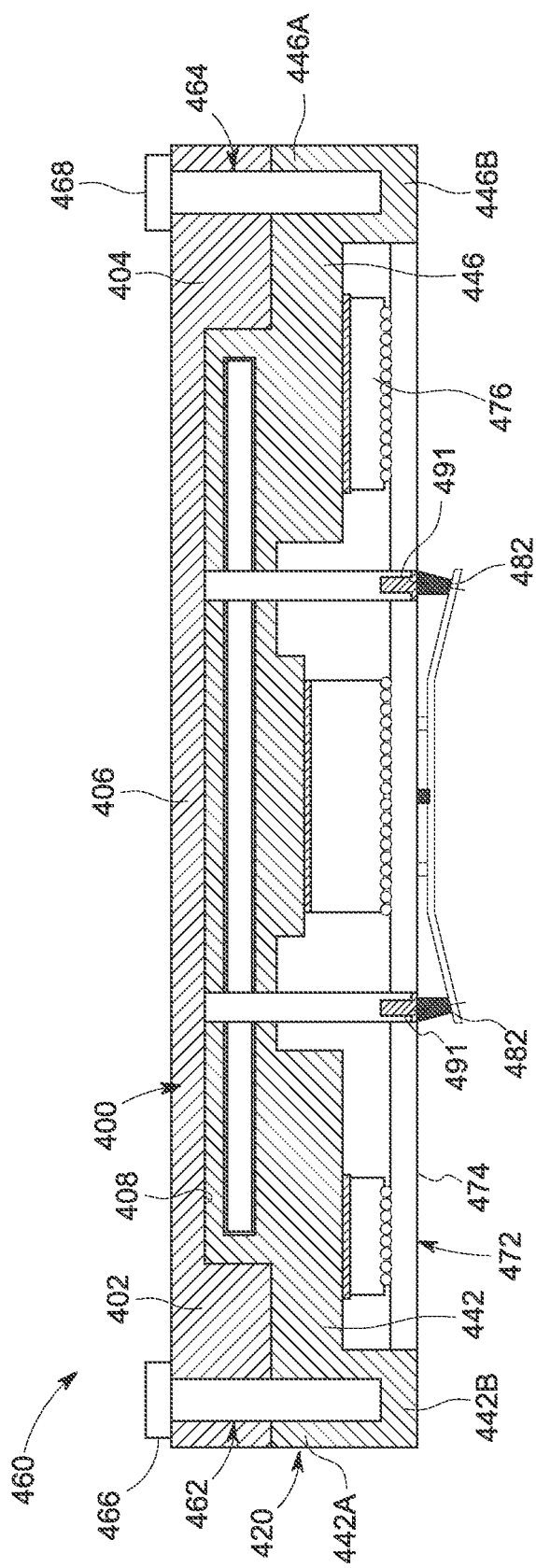
FIG. 14 illustrates a schematic front sectional view of a heat exchange assembly coupled to an electrical device in accordance with the exemplary embodiment of FIG. 6.

FIG. 14 represents a schematic front sectional view of the heat exchange assembly 460 coupled to an electrical device 472 in accordance with the exemplary embodiment of FIG. 6. As discussed previously, the heat exchange assembly 460 includes the support structure 400 and the vapor chamber 420.

The vapor chamber 420 is disposed within the recess 408 of the support structure 400 such that the first projected end portion 442 of the vapor chamber 420 overlaps the first support end 402 and the second projected end portion 446 overlaps the second support end 404. A first clamping device 466 is coupled to the first through-hole 462 formed extending through the first support end 402 of the support structure 400, the first projection 442a and the third projection 442b of the vapor chamber 420. A second clamping device 468 is coupled to the second through-hole 464 formed extending through the second support end 404 of the support structure 400, and the second projection 446a, the fourth projection 446*b* of the vapor chamber 420. The heat exchange assembly 460 further includes a plurality of spring loaded clamping devices 482. Each spring loaded clamping device 482 is coupled to a corresponding hole 491 in a corresponding first projection 418 of the support structure 400, so as to clamp the circuit card 474 to the support structure 400. The third projection 442*b* and the fourth projection 446*b* are configured to hold the circuit card 474 which support the hot component 476 of the electrical device 472.

Figure 15:
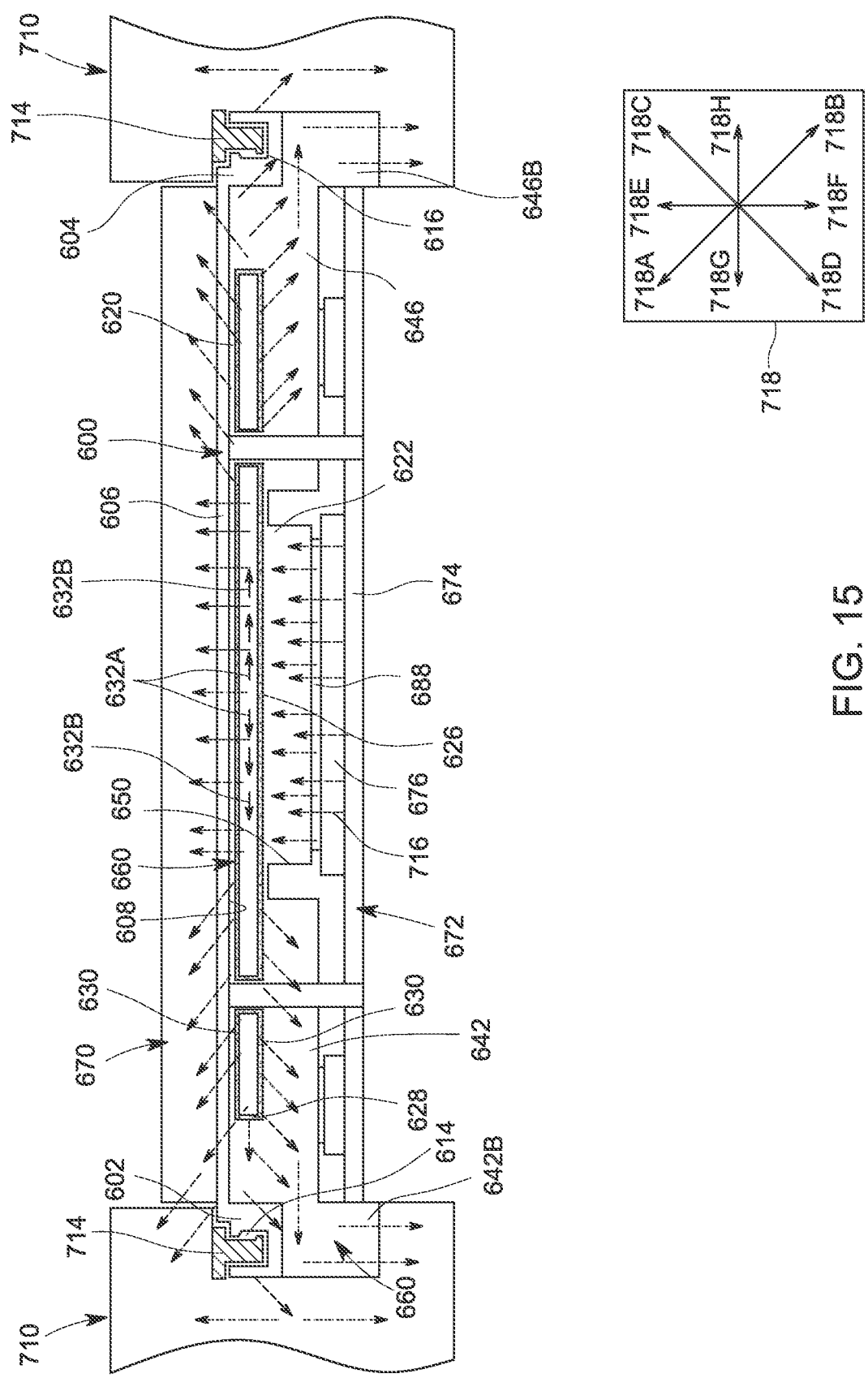
FIG. 15 illustrates a schematic front sectional view of the heat exchange assembly and the electrical device coupled to a housing in accordance with the exemplary embodiment of FIG. 13.

FIG. 15 represents a schematic front sectional view of the heat exchange assembly 660 and the electrical device 672 coupled to a housing 710 in accordance with the exemplary embodiment of FIG. 13.

The heat exchange assembly 660 has the primary heat sink 600 and the vapor chamber 620 coupled to each other. The primary heat sink 600 has the first wedge lock recess 614 and the second wedge lock recess 616 formed in the first support end 602 and the second support end 604 respectively. The vapor chamber 620 is disposed within the recess 608 of the support portion 606 of the primary heat sink 600. The secondary heat sink 670 is disposed over the support portion 606 of the primary heat sink 600. The vapor chamber 620 is disposed on the hot component 676 of the circuit card 674. The electrical device 672 is supported by the third and fourth projections 642*b*, 646*b* of the casing 622 of the vapor chamber 620. Wedges 714 are coupled to the first wedge lock recess 614 and the second wedge lock recess 616 so as to hold the heat exchange assembly 660, the secondary heat sink 670, and the electrical device 672 together.

During operation, the hot component 676 generates heat 716. The generated heat 716 is absorbed by the mid projected portion 650 and then conducted through the evaporator portion 626 of the vapor chamber 620. A working fluid 632*a* of the vapor chamber 620 absorbs the heat 716 resulting in vaporization of the working fluid 632*a* and generation of a vaporized working fluid 632*b*. The vaporized working fluid 632*b* is transported from the evaporator portion 626 to a condenser portion 628 via a transport portion 630 of the vapor chamber 620. Further, the vaporized working fluid 632*b* is condensed to regenerate the working fluid 632*a* in the condenser portion 628 by dissipating the absorbed heat 716 along a plurality of directions 718 in the casing 622.

In the illustrated embodiment, the condensation of the vaporized working fluid 632*b* includes dissipating the absorbed heat 716 to the support structure 600, along one or more directions 718*a*, 718*b*, 718*c*, 718*d*, 718*e*, 718*g*, 718*h*. The absorbed heat 716 is further dissipated from the support structure 600 to the secondary heat sink 670, along one or more directions 718*a*, 718*c*, 718*e*. The absorbed heat 716 is later dissipated to the housing 710, along one or more directions 718*g*, 718*d*, 718*h*, 718*b*.

In another embodiment, the condensation of the vaporized working fluid 632*b* includes dissipating the absorbed heat 716 to a first projected end portion 642, along one or more directions 718*g*, 718*d* and to a second projected end portion, 646, along one or more directions 718*h*, 718*b*. Further, the absorbed heat 716 is dissipated from a third projection 642*b* and a fourth projection 646*b* to the housing 710, along one or more directions 718*d*, 718*h*, 718*b*. It should be specifically noted herein the various directions indicated herein are only for illustrative and descriptive purposes and should not be construed as a limitation of the invention.

Figure 16B:
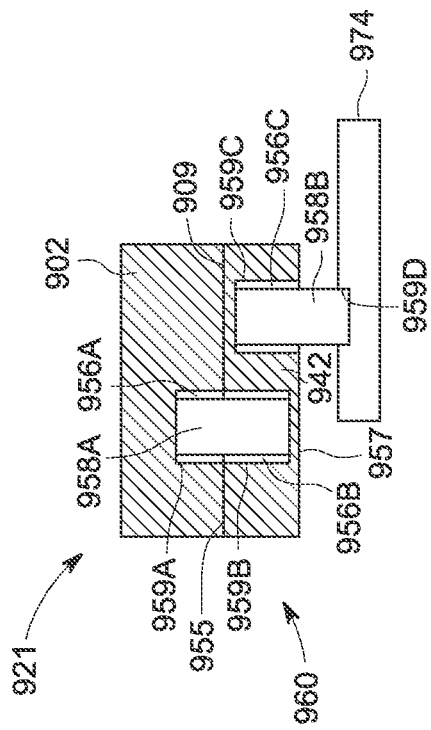
FIG. 16b illustrates a portion of a heat exchange assembly having a support structure coupled to a vapor chamber which is coupled to an electrical device in accordance with yet another exemplary embodiment.
Figure 16D:
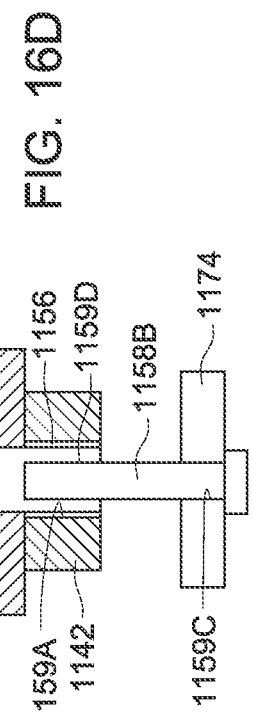
FIG. 16d illustrates a portion of a heat exchange assembly having a support structure coupled to a vapor chamber which is coupled to an electrical device in accordance with yet another exemplary embodiment.
Figure 16A:
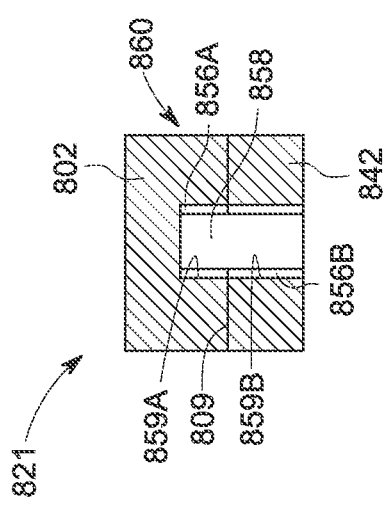
FIG. 16a illustrates a portion of the heat exchange assembly having a support structure coupled to a vapor chamber in accordance with yet another exemplary embodiment.

FIG. 16*a* illustrates a portion 821 of a heat exchange assembly 860 having a support structure coupled to a vapor chamber in accordance with yet another exemplary embodiment. The support structure includes the first support end 802 and the vapor chamber includes the first projected end portion 842. The first support end 802 includes a blind-hole 859*a* formed in a surface 809 of the support structure. A first threaded insert 856*a* is disposed in the blind-hole 859*a*. Similarly, the first projected end portion 842 includes a through-hole 859*b*. A second threaded insert 856*b* is inserted into the through-hole 859*b*. Further, a threaded stud 858 is coupled to the first support end 802 and the first projected end portion 842 via the first and second threaded inserts 856*a*, 856*b* so as to couple the support structure to the vapor chamber.

In one embodiment, the first and second threaded inserts 856*a*, 856*b* are made of a first material and the first support end 802 is made of a second material different from the first material. The vapor chamber is made of a third material different from the first material. The first, second, and third materials may include aluminum nitride, copper, or the like.

FIG. 16*b* illustrates a portion 921 of a heat exchange assembly 960 having a support structure coupled to a vapor chamber which is coupled to an electrical device in accordance with yet another exemplary embodiment. In the illustrated embodiment, the support structure includes a first support end 902, the vapor chamber includes a first projected end portion 942, and the electrical device includes a circuit card 974. The portion 921 further includes a first threaded insert 956*a*, a second threaded insert 956*b*, a third threaded insert 956*c*, a first threaded stud 958*a*, and a second threaded stud 958*b*. The first support end 902 includes a first blind-hole 959*a* formed in a surface 909 of the support structure. A first threaded insert 956*a* is disposed in the first blind-hole 959*a* and the first projected end portion 942 includes a second blind-hole 959*b* formed in a surface 955 of the vapor chamber. Similarly, the first projected end portion 942 further includes a third blind-hole 959*c* formed in a surface 957 of the vapor chamber. A second threaded insert 956*b* and a third threaded insert 956*c* are inserted into the first blind-hole 959*b* and the third blind-hole 959*c* respectively. Further, the first threaded stud 958*a* is coupled to the first support end 902 and the first end projection 942*a* via the first and second threaded inserts 956*a*, 956*b* so as to couple the support structure 900 to the vapor chamber 920. The second threaded stud 958*b* is coupled via the third threaded insert 956*c* to the first projected end portion 942 and a fourth blind-hole 959*d* formed in a circuit card 974 of the electrical device so as to couple the electrical device to the heat exchange assembly 960.

Figure 16C:
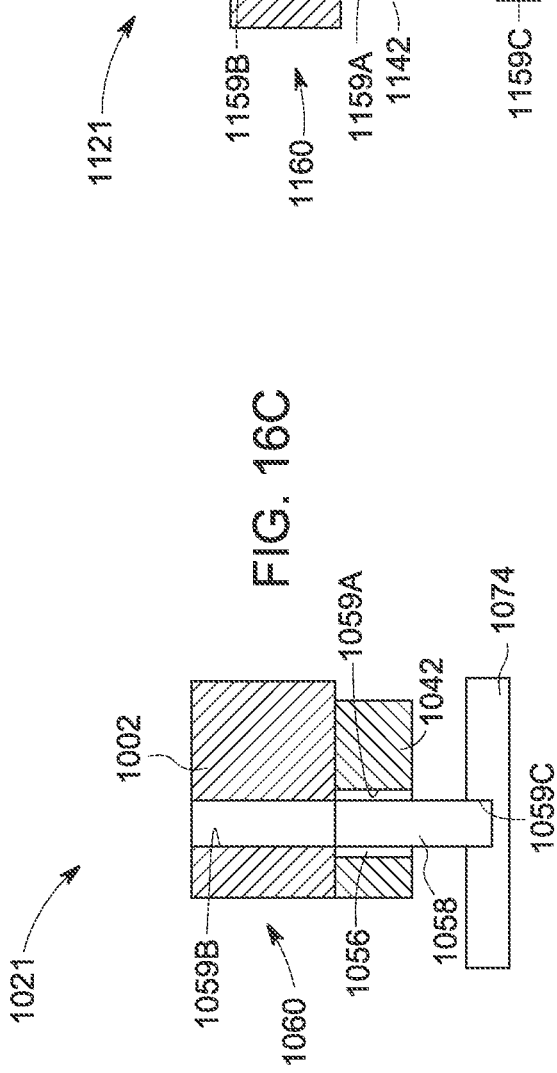
FIG. 16c illustrates a portion of a heat exchange assembly having a support structure coupled to a vapor chamber which is coupled to an electrical device in accordance with yet another exemplary embodiment.

FIG. 16*c* illustrates a portion 1021 of a heat exchange assembly 1060 having a support structure coupled to a vapor chamber which is coupled to an electrical device in accordance with yet another exemplary embodiment. In the illustrated embodiment, the support structure includes a first support end 1002, the vapor chamber includes a first projected end portion 1042, and the electrical device includes a circuit card 1074. The first projected end portion 1042 includes a first through-hole 1059*a*, the first support end 1002 includes a second through-hole 1059*b*, and the circuit card 1074 includes a blind-hole 1059*c*. A threaded insert 1056 is disposed into the first through-hole 1059*a*. A threaded stud 1058 is coupled to the first projected end portion 1042 via the threaded insert 1056 and to the second through-hole 1059*b* formed in the first support end 1002 so as to couple the support structure to the vapor chamber. Further, the threaded stud 1058 is coupled to the blind-hole 1059*c* formed in the circuit card 1074 so as to couple the electrical device to the heat exchange assembly 1060.

FIG. 16*d* illustrates a portion 1121 of a heat exchange assembly 1160 having a support structure coupled to a vapor chamber which is coupled to an electrical device in accordance with yet another exemplary embodiment. In the illustrated embodiment, the support structure includes a first support end 1102, the vapor chamber includes a first projected end portion 1142, and the electrical device includes a circuit card 1174. The first projected end portion 1142 includes a first through-hole 1159a, the first support end 1102 includes a second through-hole 1159b, and the circuit card 1172 includes a third through-hole 1159c. A threaded insert 1156 is inserted into the first through-hole 1159a. A hollow threaded screw 1158a is coupled to the first projected end portion 1142 via the threaded insert 1156 and to the first support end 1102 via the second through-hole 1159b so as to couple the vapor chamber to the support structure. Similarly, a threaded screw 1158b is coupled to the third through-hole 1159c formed in the circuit card 1174 and to a threaded hollow portion 1159d of the hollow threaded screw 1158a so as to couple the electrical device to the heat exchange assembly 1160.

Figure 17A:
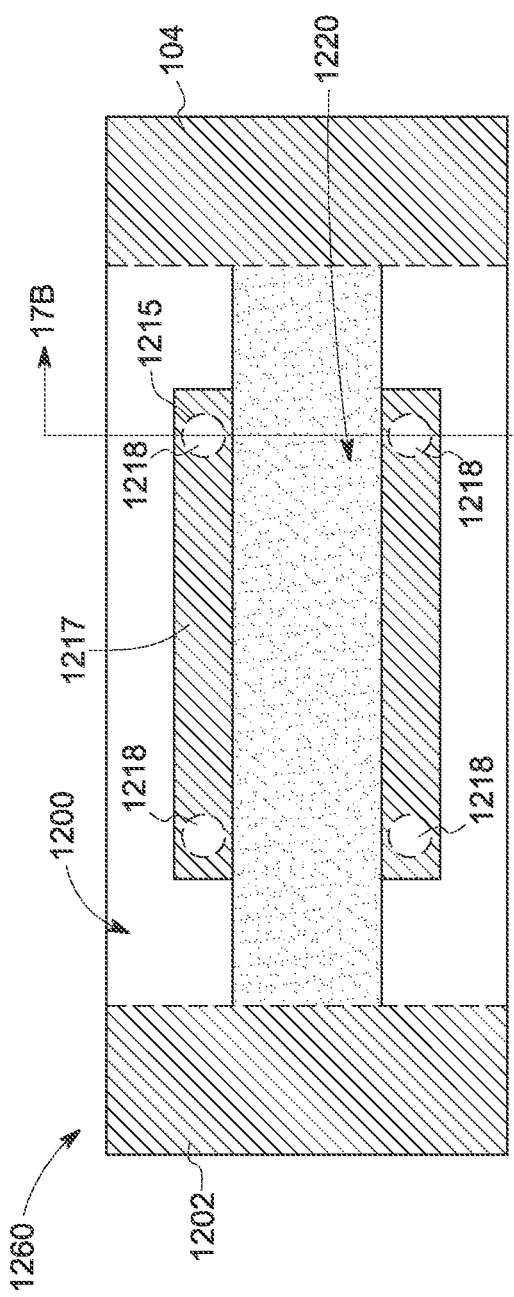
FIG. 17a illustrates a top view of a heat exchange assembly having a support structure and a vapor chamber in accordance with yet another exemplary embodiment.

FIG. 17a illustrates a schematic top view of a heat exchange assembly 1260 having a support structure 1200 and a vapor chamber 1220 in accordance with yet another exemplary embodiment. In the illustrated embodiment, the support structure 1200 includes a plurality of cross-bars 1217 having a plurality of holes 1215. Each projection among a plurality of first projections 1218 extend through a corresponding hole among the plurality of holes 1215 The vapor chamber 1220 extends between a first support end 1202 and a second support end 104 of the support structure 1200 and is surrounded by the plurality of cross-bars 1217.

Figure 17B:
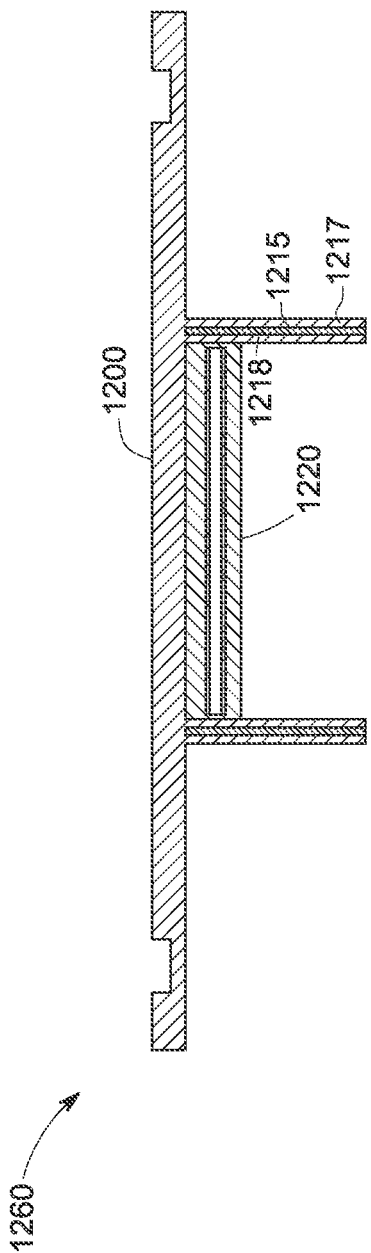

FIG. 17b illustrates a sectional front view along an axis 17b-17b of the heat exchange assembly 1260 having the support structure 1200 and the vapor chamber 1220 in accordance with the exemplary embodiments of FIG. 17a.

In accordance with embodiments discussed herein, the exemplary heat exchange assembly facilitates an efficient way of dissipating heat from a hot component to a housing of an electrical device. Further, a spring loaded clamping device and a wedge lock clamping device allows accommodating dimensional tolerances of the hot component during assembling of the heat exchange assembly. Further, a first support end and a second support end of a support structure allows easy clamping of the heat exchange assembly to the housing of the electrical device. The plurality of second projections provide structural support to a vapor chamber and further enable to couple the support structure to the electrical device.

The invention claimed is:

1. A system comprising:
a support structure comprising a first support end, a second support end, a recess between the first support end and the second support end, a support portion extending between the first support end and the second support end, and a plurality of projections protruding from a portion of a surface of the support structure corresponding to the support portion, wherein the support structure is a primary heat sink; and
a vapor chamber comprising a casing and a wick disposed within the casing, wherein the vapor chamber is disposed within the recess and coupled to the surface of the support structure between the plurality of projections, wherein the casing comprises a first projected portion, a second projected portion, and a mid projected portion disposed between the first projected portion and the second projected portion at an evaporator portion of the vapor chamber, and wherein the first projected portion, the second projected portion, and the mid projected portion, together, comprise a non-uniform surface configured to contact a circuit card.

2. The system of claim 1, wherein the first support end and the second support end has a first thickness, and the mid projected portion has a second thickness different from the first thickness to define the non-uniform surface.

3. The system of claim 1, wherein each end from the first support end and the second support end comprises a wedge lock recess.

4. The system of claim 3, further comprising a secondary heat sink clamped to the support portion of the support structure and the wedge lock recess via a plurality of wedges.

5. The system of claim 1, further comprising a plurality of spring loaded clamping devices, each spring loaded clamping device is coupled, via a corresponding hole in the circuit card, to a corresponding projection among the plurality of projections.

6. The system of claim 1, wherein the casing comprises a first half casing portion and a second half casing portion coupled to each other by welding or brazing or bolting.

7. The system of claim 6, wherein each of the first half casing portion and the second half casing portions has a U-shape.

8. The system of claim 1, wherein the mid projected portion of the non-uniform surface is configured to contact the circuit card via an electrical component mounted on the circuit card.

9. The system of claim 8, wherein the first projected portion is configured to transfer heat to a housing configured to surround, at least partially, the circuit card, the support structure, and the vapor chamber.

10. The system of claim 1, wherein the plurality of projections are directly coupled to the surface of the support structure or integrally formed with the support structure.

11. The system of claim 1, comprising a secondary heat sink coupled to the support portion of the support structure.

12. A system comprising:
a hot component coupled to a circuit card having a plurality of holes, wherein the hot component and the circuit card are disposed within a housing;
a support structure comprising a recess, a first support end, a second support end, a support portion extending between the first support end and the second support end, and a plurality of projections protruding from a portion of a surface of the support structure, corresponding to the support portion, wherein the support structure is a primary heat sink;
a vapor chamber comprising a casing and a wick disposed within the casing, wherein the vapor chamber is disposed within the recess and coupled to the surface of the support structure between the plurality of projections, wherein the casing comprises a mid projected portion disposed at an evaporator portion of the vapor chamber, and wherein the first and second support ends, and the mid projected portion comprise a non-uniform surface, wherein the vapor chamber is coupled to the hot component via a thermal interface material; and
a plurality of spring loaded clamping devices, each spring loaded clamping device is coupled via a corresponding hole from the plurality of holes to a corresponding projection from the plurality of projections so as to clamp the circuit card to the support structure.

13. The system of claim 12, wherein the first support end and the second support end has a first thickness, and the mid projected portion has a second thickness different from the first thickness to define the non-uniform surface.

14. The system of claim 13, wherein each end from the first support end and the second support end comprises a wedge lock recess.

15. The system of claim 14, further comprising a secondary heat sink clamped to the support portion of the support structure and the wedge lock recess via a plurality of wedges.

16. The system of claim 12, wherein the casing comprises a first half casing portion and a second half casing portion coupled to each other by welding or brazing or bolting.

17. The system of claim 16, wherein each of the first half casing portion and the second half casing portions has a U-shape.

18. A system comprising:
- a support structure comprising a first support end, a second support end, a recess between the first support end and the second support end, a support portion extending between the first support end and the second support end, and a plurality of projections protruding from a portion of a surface of the support structure corresponding to the support portion, wherein the support structure is a primary heat sink; and
- a vapor chamber comprising a casing and a wick disposed within the casing, wherein the vapor chamber is disposed within the recess and coupled to the surface of the support structure between at least two of the plurality of projections, wherein the casing comprises a first projected portion, a second projected portion, and a mid projected portion disposed between the first projected portion and the second projected portion at an evaporator portion of the vapor chamber, and wherein the first projected portion, the second projected portion, and the mid projected portion, together, comprise a non-uniform surface configured to contact a circuit card, wherein the first projected portion is configured to contact the circuit card via a first electrical component, and wherein the mid projected portion is configured to contact the circuit card via a second electrical component.

19. The system of claim 18, wherein the casing comprises a third projected portion and a fourth projected portion configured to directly contact the circuit card.

20. The system of claim 19, wherein the third projected portion is disposed at a first end of the casing and the fourth projected portion is disposed at a second end, opposite the first end, of the casing.

* * * * *